(12) United States Patent
Kim et al.

(10) Patent No.: US 11,698,693 B2
(45) Date of Patent: Jul. 11, 2023

(54) INPUT-SENSING UNIT, FABRICATING METHOD THEREOF, AND DISPLAY DEVICE THEREWITH

(71) Applicant: Samsung Display Co., Ltd., Yongin-si (KR)

(72) Inventors: Young Gu Kim, Yongin-si (KR); Jiyun Park, Hwaseong-si (KR); Bongsung Seo, Suwon-si (KR); Jongho Son, Seoul (KR); Yeonhee Lee, Anyang-si (KR); Hyelim Jang, Hwaseong-si (KR); Baekkyun Jeon, Yongin-si (KR); Kyungseon Tak, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/178,166

(22) Filed: Feb. 17, 2021

(65) Prior Publication Data
US 2021/0373692 A1 Dec. 2, 2021

(30) Foreign Application Priority Data
May 27, 2020 (KR) ........................ 10-2020-0063351

(51) Int. Cl.
*G06F 3/044* (2006.01)
*H10K 59/12* (2023.01)
(Continued)

(52) U.S. Cl.
CPC .......... *G06F 3/0412* (2013.01); *G06F 3/0443* (2019.05); *G06F 3/0446* (2019.05); *H10K 50/844* (2023.02); *H10K 59/12* (2023.02); *H10K 59/40* (2023.02); *H10K 77/111* (2023.02); *G06F 2203/04103* (2013.01); *H10K 2102/311* (2023.02)

(58) Field of Classification Search
CPC .......... Y02E 10/549; H01L 2251/5338; H01L 51/5253; H01L 51/0097; H01L 27/3244; H01L 27/323; H01B 13/00; H01B 5/04; H01B 3/30; H01B 5/14; G06F 2203/04103; G06F 2203/04102; G06F 3/0446; G06F 3/0443; G06F 3/0418; G06F 3/0412; G06F 3/041; G06F 1/1641
See application file for complete search history.

(56) References Cited

U.S. PATENT DOCUMENTS

| 10,459,625 | B2 | 10/2019 | Seo et al. |
| 2017/0220162 | A1 | 8/2017 | Ko et al. |
(Continued)

FOREIGN PATENT DOCUMENTS

| KR | 10-2017-0091213 | 8/2017 |
| KR | 10-2045407 | 11/2019 |

Primary Examiner — Julie Anne Watko
(74) Attorney, Agent, or Firm — H.C. Park & Associates, PLC

(57) ABSTRACT

The present application relates to an input sensing unit and a display device using the same. The input-sensing unit including a first conductive layer, a first organic layer, a second conductive layer, and a second organic layer sequentially stacked one over another, in which the first organic layer includes a first base resin and a first hollow polymer, and the second organic layer includes a second base resin and a second hollow polymer.

13 Claims, 14 Drawing Sheets

(51) Int. Cl.
    *H10K 50/844*     (2023.01)
    *H10K 59/40*     (2023.01)
    *H10K 77/10*     (2023.01)
    *G06F 3/041*     (2006.01)
    *H10K 102/00*     (2023.01)

(56) References Cited

U.S. PATENT DOCUMENTS

2019/0326360 A1* 10/2019 Gwon .................... G06F 3/0412
2021/0028395 A1* 1/2021 Kim ....................... H01L 27/323

* cited by examiner

INPUT-SENSING UNIT, FABRICATING METHOD THEREOF, AND DISPLAY DEVICE THEREWITH

CROSS-REFERENCE TO RELATED APPLICATION

This application claims priority from and the benefit of Korean Patent Application No. 10-2020-0063351, filed on May 27, 2020, which is hereby incorporated by reference for all purposes as if fully set forth herein,

BACKGROUND

Field

Exemplary embodiments of the invention relate generally to an input-sensing unit, a fabricating method thereof, and a display device therewith, and in particular, to an input-sensing unit with improved touch sensitivity.

Discussion of the Background

Various display devices are being developed for use in multimedia devices, such as televisions, cell phones, tablet computers, gaming machines, and the like. The display device include a display panel, which displays an image for a user, and an input device, such as a keyboard, a mouse, or a touch panel.

With the development of recent display devices, such as a display device with a curved surface, a rollable display device, or a foldable display device, researches are being conducted on a touch panel that has good flexibility and touch sensitivity.

The above information disclosed in this Background section is only for understanding of the background of the inventive concepts, and, therefore, it may contain information that does not constitute prior art.

SUMMARY

Input-sensing units constructed according to exemplary embodiments of the invention are capable of improving flexibility and touch sensitivity.

Exemplary embodiments also provide a simplified method fabricating an input-sensing unit.

Exemplary embodiments further provide a display device including a highly-reliable input-sensing unit.

Additional features of the inventive concepts will be set forth in the description which follows, and in part will be apparent from the description, or may be learned by practice of the inventive concepts.

An input-sensing unit according to an exemplary embodiment includes a first conductive layer, a first organic layer, a second conductive layer, and a second organic layer sequentially stacked one over another, in which the first organic layer includes a first base resin and a first hollow polymer, and the second organic layer includes a second base resin and a second hollow polymer.

The first and second base resins may include substantially the same material, and the first and second hollow polymers may include substantially the same material.

The first and second organic layers may have dielectric constants ranging from about 1.3 to about 3.0.

A content of the first hollow polymer in the first organic layer and a content of the second hollow polymer in the second organic layer may each be in a range of about 10 wt % to about 70 wt %.

The first hollow polymer may include a first shell that defines a first hollow therein, the second hollow polymer may include a second shell that defines a second hollow therein, and each of the first and second shells may include at least one of polyimide, polyurethane, polystyrene, acrylic resin, and epoxy resin.

Each of the first and second hollows may have a mean diameter ranging from about 20 nm to about 150 nm.

At least one of the first and second conductive layers may include at least one of molybdenum, silver, titanium, copper, aluminum, alloys thereof, indium tin oxide, indium zinc oxide, zinc oxide, and indium tin zinc oxide.

A method of fabricating an input-sensing unit according to another exemplary embodiment includes forming a first conductive layer on an inorganic layer, supplying and curing an organic layer compound on the first conductive layer to form a first organic layer, forming a second conductive layer on the first organic layer, and supplying and curing the organic layer compound on the second conductive layer to form a second organic layer, in which the organic layer compound includes a base resin and a hollow polymer.

The base resin may include at least one of polyimide, polyurethane, siloxane resin, acrylic resin, and epoxy resin.

The hollow polymer may include a shell that defines a hollow therein, and the shell may include at least one of polyimide, polyurethane, polystyrene, acrylic resin, and epoxy resin.

A content of the hollow polymer in the organic layer compound may range from about 10 wt % to about 70 wt %.

Curing the organic layer compound may include curing the organic layer compound using an ultraviolet light or heat.

The method may further include forming a plurality of penetration hole in the first organic layer, after the forming of the first organic layer.

The organic layer compound may further include at least one of a dispersing agent or a curing initiator.

A display device according to still another exemplary embodiment includes a display panel, a first conductive layer disposed on the display panel, a first organic layer disposed on the first conductive layer, a second conductive layer disposed on the first organic layer, and a second organic layer disposed on the second conductive layer, in which the first organic layer includes a first base resin and a first hollow polymer, and the second organic layer includes a second base resin and a second hollow polymer.

The first and second base resins may include substantially the same material, and the first and second hollow polymers may include substantially the same material.

The display panel may include a light-emitting device layer and a thin encapsulation layer covering the light-emitting device layer, and the first conductive layer may be directly disposed on the thin encapsulation layer.

The display device may further include an inorganic layer disposed on the display panel, in which the first conductive layer may be directly disposed on the inorganic layer.

The display panel may include a flexible display panel.

At least one of the first and second conductive layers may include a plurality of conductive patterns, and the plurality of conductive patterns may include a sensing electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
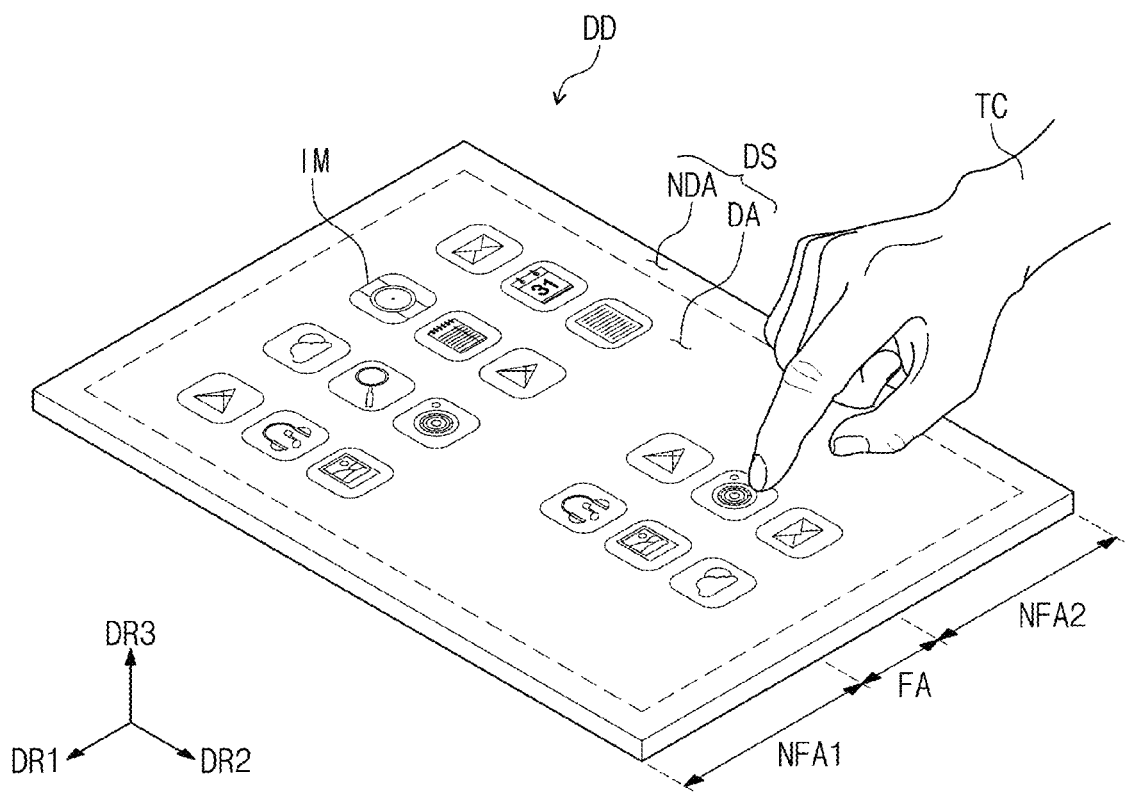
FIG. 1A is a perspective view illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
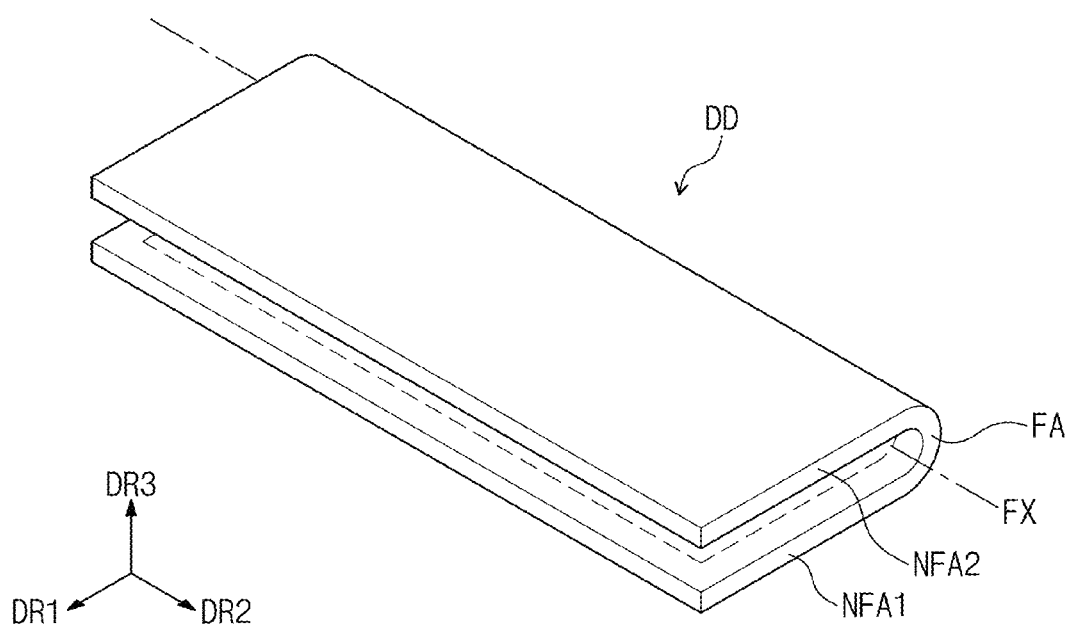
FIG. 1B is a perspective view illustrating the display device of FIG. 1A in a folded state.

FIG. 1A is a perspective view illustrating a display device DD according to an exemplary embodiment. FIG. 1B is a perspective view illustrating the display device DD of FIG. 1A in a folded state.

Referring to FIGS. 1A and 1B, the display device DD may be a foldable display device. The display device DD may be used for large-sized electronic devices (e.g., television sets and monitors) or small- or medium-sized electronic devices (e.g., smart phones, tablets, car navigation systems, game machines, and smart watches).

A top surface of the display device DD may be defined as a display surface DS. When the display device DD is in an unfolded state, the display surface DS may be parallel to a plane defined by a first direction DR1 and a second direction DR2.

The display surface DS may include a display region DA and a non-display region NDA, which is adjacent to the display region DA. The display region DA may be a region on which an image IM is displayed, and the non-display region NDA may be a region which is not used to display the image IM. In FIG. 1A, application icons are exemplarily illustrated as an example of the image IM.

The display region DA may have substantially a rectangular shape. The non-display region NDA may enclose the display region DA. However, the inventive concepts are not limited thereto, and the shapes of the display and non-display regions DA and NDA may be variously changed. For example, at least a portion of the non-display region NDA may have a curved shape in some exemplary embodiments.

The display device DD may include a first non-folding region NFA1, a folding region FA, and a second non-folding region NFA2, which are sequentially defined in the first direction DR1. FIGS. 1A and 1B exemplarily illustrate the display device DD including one folding region and two non-folding regions, but the inventive concepts are not limited to particular numbers of the folding and non-folding regions in the display device DD. For example, in some exemplary embodiments, the display device DD may include three or more non-folding regions and two or more folding regions therebetween.

The display device DD may be folded along a folding axis FX. In particular, the folding region FA may be bent along the folding axis FX. The folding axis FX may be substantially parallel to the second direction DR2. The folding axis FX may be defined to be substantially parallel to a long side of the display device DD.

When the display device DD is folded, the first and second non-folding regions NFA1 and NFA2 may be disposed, such that the display surfaces thereof may face each other. As such, in the folded state, the display surface DS may not be exposed to the outside. However, the inventive concepts are not limited to. In another exemplary embodiment, the display device DD may be folded such that the display surfaces of the first and second non-folding regions NFA1 and NFA2 are opposite to each other. In this case, in the folded state, the display surface DS may be exposed to the outside.

Figure 2A:
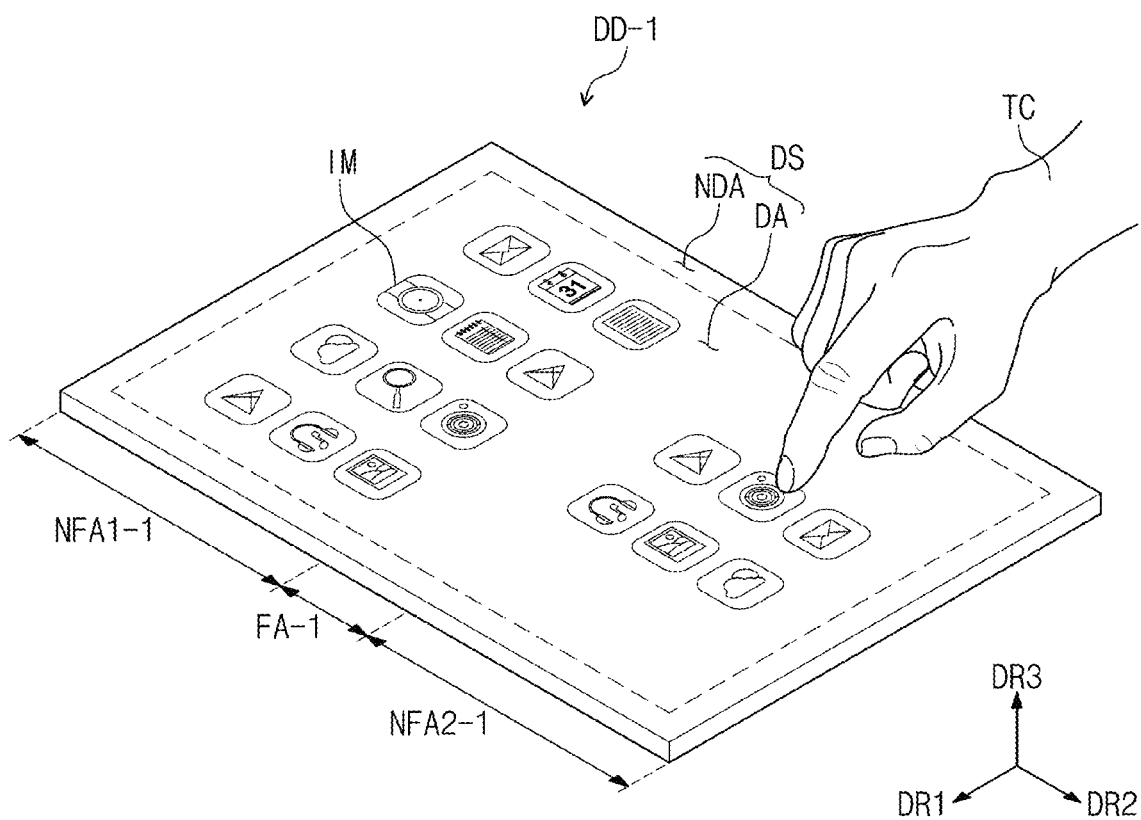
FIG. 2A is a perspective view illustrating a display device according to an exemplary embodiment.
Figure 2B:
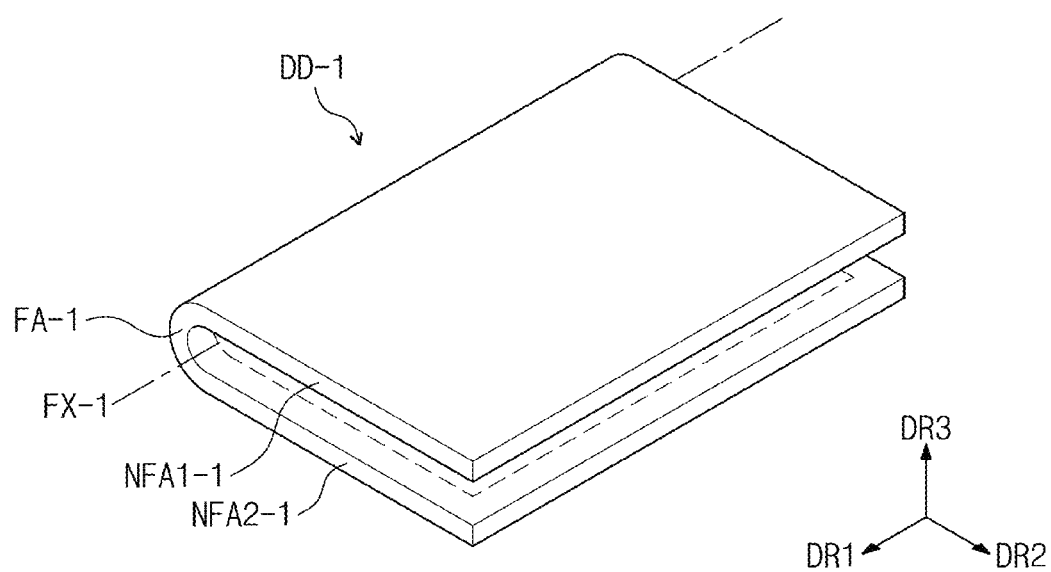
FIG. 2B is a perspective view illustrating the display device of FIG. 2A in a folded state.

FIG. 2A is a perspective view illustrating a display device DD-1 according to an exemplary embodiment. FIG. 2B is a perspective view illustrating the display device DD-1 of FIG. 2A in a folded state.

Referring to FIGS. 2A and 2B, the display device DD-1 may include a first non-folding region NFA1-1, a folding region FA-1, and a second non-folding region NFA2-1, which are sequentially defined in the second direction DR2.

The display device DD-1 may be folded along a folding axis FX-1. In particular, the folding region FA-1 may be bent along the folding axis FX-1. The folding axis FX-1 may be substantially parallel to the first direction DR1. The folding axis FX-1 may be defined to be substantially parallel to a short side of the display device DD.

As used herein, a foldable display device will exemplarily be illustrated as a display device, but the inventive concepts are not limited thereto. For example, the inventive concepts may be applied to any one of flexible display devices (e.g., a rollable display device, a stretchable display device, or the like) or rigid display devices.

Figure 3:
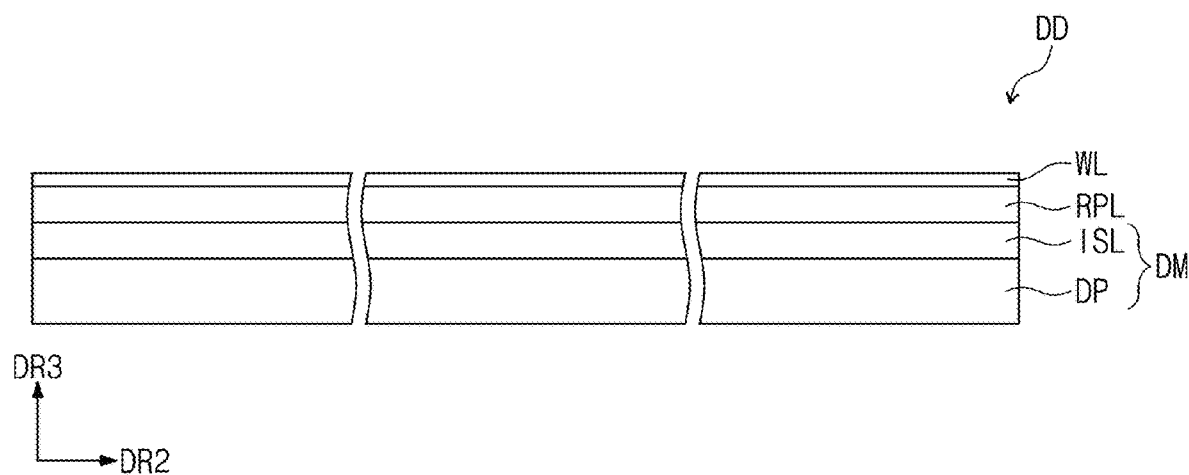
FIG. 3 is a cross-sectional view of a display device according to an exemplary embodiment.
Figure 4:
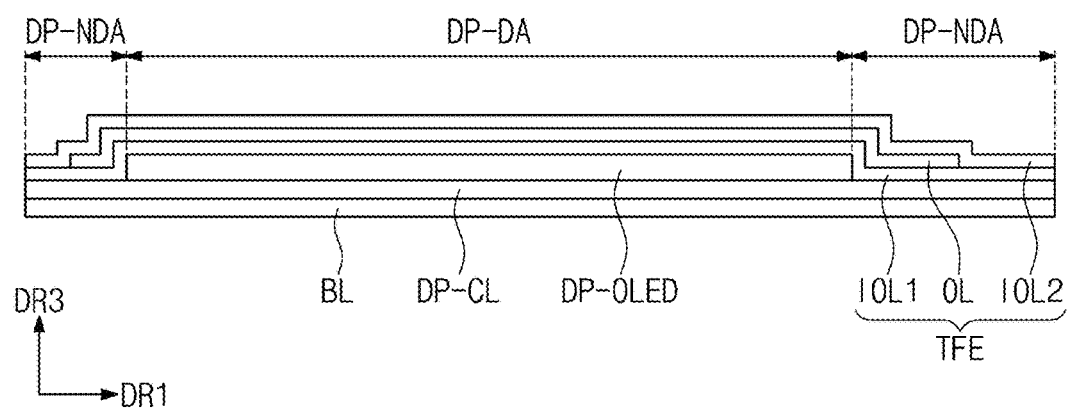
FIG. 4 is an enlarged cross-sectional view of a portion of a display panel according to an exemplary embodiment.
Figure 5A:
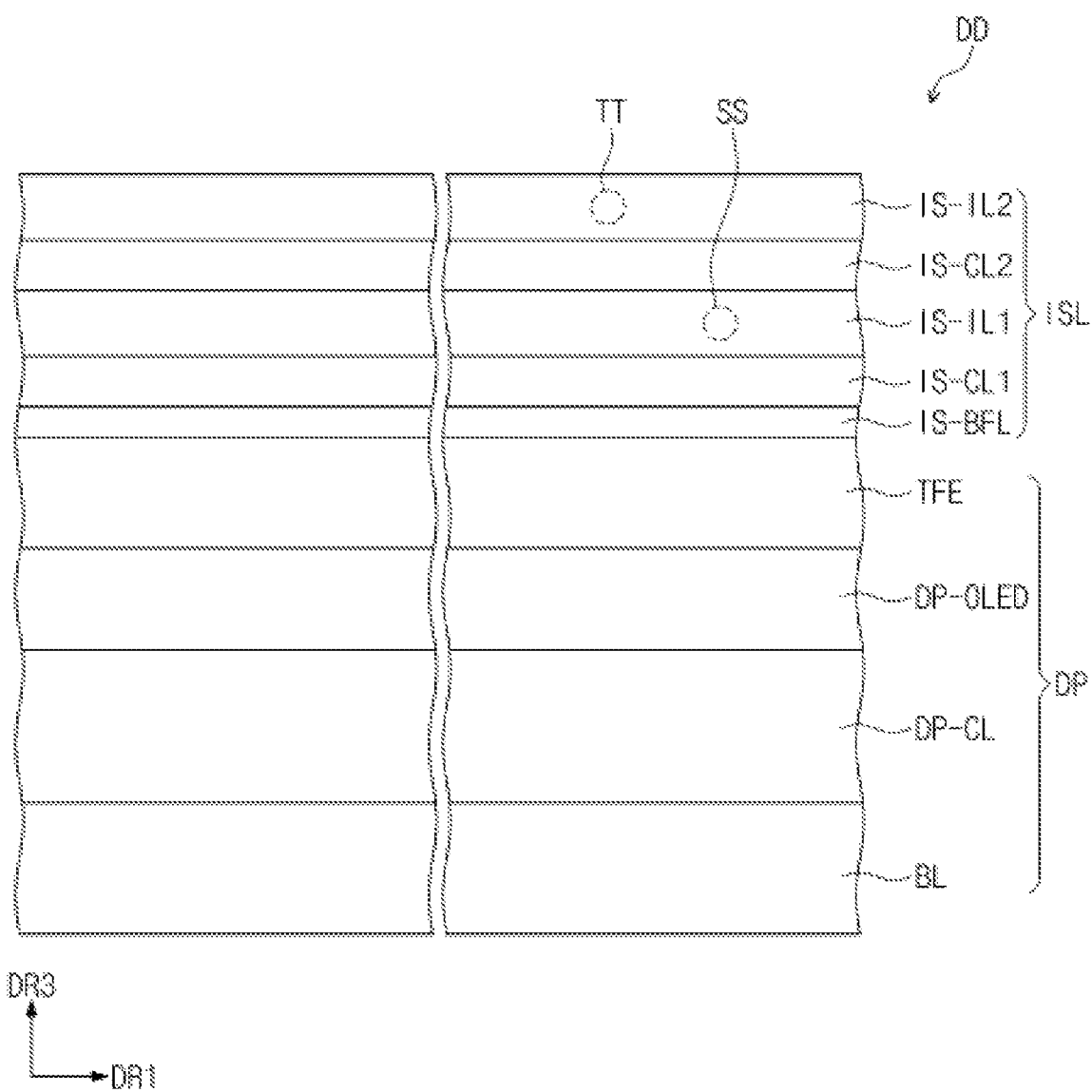
FIG. 5A is a cross-sectional view of a display device according to an exemplary embodiment.
Figure 5B:
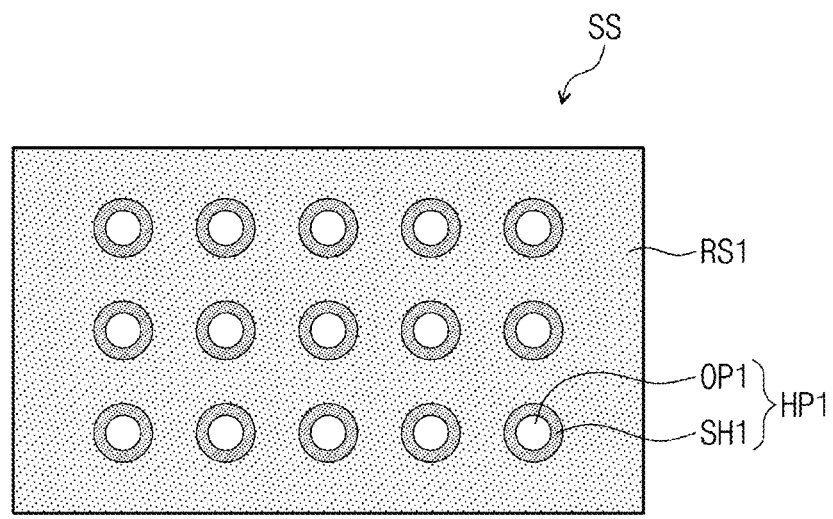
FIG. 5B is an enlarged view of region SS of FIG. 5A.
Figure 5C:
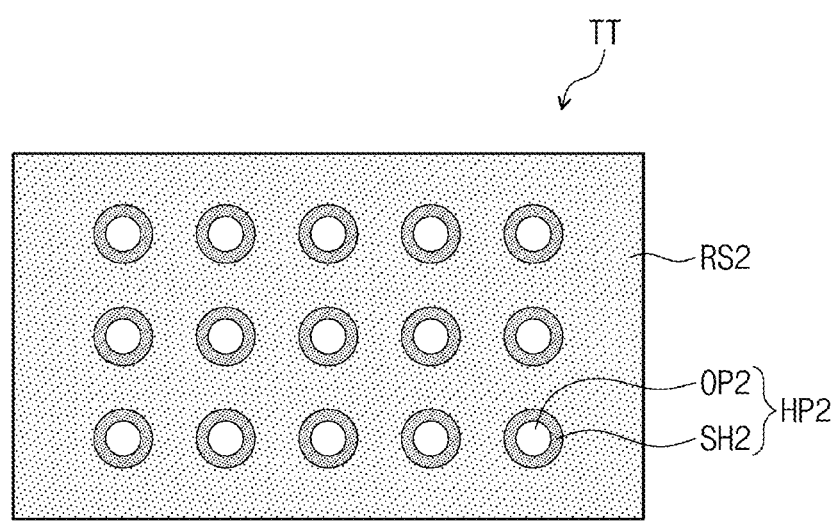
FIG. 5C is an enlarged view of region TT of FIG. 5A.

FIG. 3 is a cross-sectional view illustrating the display device DD according to an exemplary embodiment. FIG. 4 is an enlarged cross-sectional view a display panel DP according to an exemplary embodiment. FIG. 5A is a cross-sectional view illustrating the display device DD according to an exemplary embodiment. FIG. 5B is an enlarged view of region SS of FIG. 5A. FIG. 5C is an enlarged view of region TT of FIG. 5A.

FIGS. 3, 4, and 5A illustrates cross-sections taken parallel to the second and third directions DR2 and DR3. In FIGS.

3, 4, and 5A, the display device DD is schematically shown to better illustrate a stacking structure of functional units of the display device DD.

In FIGS. 3, 4, and 5A, when one of an input-sensing unit, an anti-reflection unit, and a window unit is formed on another element by a successive process, the unit will be referred as a "layer". On the other hand, when one of the input-sensing unit, the anti-reflection unit, and the window unit is bonded to another element by an adhesive member, the unit will be referred as a "panel". The unit identified with the term "panel" may include a base layer (e.g., a synthetic resin film, a composite film, or a glass substrate) providing a base surface, but the unit identified with the term "layer" may not include a base layer.

Referring to FIG. 3, the display device DD may include the display panel DP, an input-sensing unit ISL, an anti-reflection unit RPL, and a window unit WL. FIG. 3 illustrates an exemplary embodiment, in which the input-sensing unit ISL, the anti-reflection unit RPL, and the window unit WL are layers, each of which is formed by a successive process. For example, the input-sensing unit ISL may be directly disposed on the display panel DP.

As used herein, the expression "an element B may be directly disposed on an element A" means that an adhesive layer or member is not disposed between the elements A and B. More particularly, the element A is formed, and then the element B is formed on a base surface provided by the element A through a successive process.

The display panel DP and the input-sensing unit ISL, which is directly disposed on the display panel DP, may be collectively defined as a display module DM.

In some exemplary embodiments, adhesive layers may be respectively disposed between the display module DM and the anti-reflection unit RPL, and between the anti-reflection unit RPL and the window unit WL.

The display panel DP may be used to display an image IM, and the input-sensing unit ISL may be used to obtain coordinate information on a position of an external input (e.g., a touch event or light). In some exemplary embodiments, the display module DM may further include a protection member disposed on a bottom surface of the display panel DP.

According to an exemplary embodiment, the display panel DP may be a light-emitting type display panel, but the inventive concepts are not limited to a specific type of the display panel DP. For example, the display panel DP may be an organic light emitting display panel or a quantum dot light emitting display panel. An emission layer of the organic light emitting display panel may be formed of or include an organic light emitting material. An emission layer of the quantum dot light emitting display panel may include a quantum dot, a quantum rod, or the like. Hereinafter, the display panel DP will exemplarily be described as an organic light emitting display panel.

The anti-reflection unit RPL may reduce reflectance of an external light that is incident to the window unit WL from the outside. In an exemplary embodiment, the anti-reflection unit RPL may include a phase retarder, a polarizer, and/or a destructive interference structure. The phase retarder may be a film type or a liquid crystal coating type, and may include a λ/2 phase retarder and/or a λ/4 phase retarder. The polarizer may also be a film type or a liquid crystal coating type. The polarizer of the film type may include an elongated synthetic resin film, and the polarizer of the liquid crystal coating type may include liquid crystals, which are arranged to have a specific orientation. The phase retarder and the polarizer may further include a protection film. At least one of the phase retarder, the polarizer, and the protection films may be used as the anti-reflection unit RPL. For example, the destructive interference structure may include a first reflection layer and a second reflection layer, which are disposed on different layers. First reflection light and second reflection light, which are respectively reflected by the first and second reflection layers, may destructively interfere with each other and reduce the reflectance of the external light.

The anti-reflection unit RPL may include a color filter and a division pattern. The color filter may be configured to transmit light, which is emitted from the display module DM, or to change a wavelength of the light. The division pattern may include a light-blocking material and prevent mixing of light that pass through the color filter. In addition, the light-blocking material of the division pattern may absorb an external light. For example, the division pattern may be formed of or include a blue or black material.

Since the display device DD includes the color filter and the division pattern, it may be possible to reduce reflectance of an external light in the display device DD.

In an exemplary embodiment, the window unit WL may include a base layer and a light-blocking pattern. The base layer may include a glass substrate and/or a synthetic resin film. The light-blocking pattern may be partially overlapped with a rear surface of the base layer to define a bezel region of the display device DD (e.g., the non-display region NDA of FIG. 1A).

In some exemplary embodiments, the stacking order of the input-sensing unit ISL and the anti-reflection unit RPL may be changed, or the anti-reflection unit RPL may be omitted from the display device DD. In addition, the input-sensing unit ISL is exemplarily illustrated as being overlapped with the entire region of the display panel DP, but the input-sensing unit ISL may be overlapped with a portion of the display region DA or may be overlapped with only the non-display region NDA in other exemplary embodiments. The input-sensing unit ISL may be a touch-sensing panel that may sense a touch event from a user, or a fingerprint-sensing panel that may sense a fingerprint of a user's finger.

Referring to FIG. 4, the display panel DP may include a base layer BL and a circuit device layer DP-CL, a display device layer DP-OLED, and a thin encapsulation layer TFE, which are disposed on the base layer BL. In some exemplary embodiments, the display panel DP may further include functional layers, such as an anti-reflection layer and a refractive index control layer.

The base layer BL may include a synthetic resin film. The synthetic resin film may be a polyimide-based resin layer, but the inventive concepts are not limited to a specific material of the synthetic resin film. In addition, the base layer BL may include a glass substrate, a metal substrate, or a substrate including an organic/inorganic composite material.

The circuit device layer DP-CL may include at least one insulating layer and at least one circuit device. Hereinafter, the insulating layer in the circuit device layer DP-CL will also be referred to as an intermediate insulating layer. The intermediate insulating layer may include at least one intermediate inorganic layer and at least one intermediate organic layer. The circuit device in the circuit device layer DP-CL may include a plurality of signal lines, a plurality of signal pads, a pixel driving circuit, and so forth. The circuit device layer DP-CL may be formed by forming an insulating layer, a semiconductor layer, and a conductive layer using a coating or deposition process, and patterning the insulating layer, the semiconductor layer, and the conductive layer using a photolithography and etching process.

The display device layer DP-OLED may include a light-emitting device. For example, the display device layer DP-OLED may include organic light-emitting diodes. The display device layer DP-OLED may include a pixel definition layer and a light-emitting device. The light-emitting device may include a first electrode, an emission layer, and a second electrode. The first electrode may be a plurality of patterns, which are disposed between a plurality of pixel definition layers and are spaced apart from each other. The pixel definition layer may be an organic layer. The pixel definition layer may be used to separate an emission region from a non-emission region.

The first electrode, the emission layer, and the second electrode, which are not overlapped with the pixel definition layer, may be defined as the emission region. A region provided with the pixel definition layer may be defined as the non-emission region. The thin encapsulation layer TFE may be provided to hermetically seal the display device layer DP-OLED. The thin encapsulation layer TFE may include at least one insulating layer. In an exemplary embodiment, the thin encapsulation layer TFE may include at least one inorganic layer (hereinafter, an inorganic encapsulation layer). In an exemplary embodiment, the thin encapsulation layer TFE may include at least one organic layer (hereinafter, an organic encapsulation layer) and at least one inorganic encapsulation layer.

The inorganic encapsulation layer may be used to protect the display device layer DP-OLED from moisture or oxygen, and the organic encapsulation layer may be used to protect the display device layer DP-OLED from a contamination material such as dust particles. The inorganic encapsulation layer may include at least one of a silicon nitride layer, a silicon oxynitride layer, a silicon oxide layer, a titanium oxide layer, or an aluminum oxide layer, but the inventive concepts are not limited thereto. The organic encapsulation layer may include an acrylic organic layer, without being limited thereto.

The display panel DP may include a display region DP-DA and a non-display region DP-NDA, when viewed in a plan view. In the illustrated exemplary embodiment, the non-display region DP-NDA may be defined along a border of the display region DP-DA. The display and non-display regions DP-DA and DP-NDA of the display panel DP may correspond to the display and non-display regions DA and NDA, respectively, of the display device DD shown in FIGS. 1A to 2A.

In an exemplary embodiment, a first inorganic encapsulation layer IOL1 may be disposed to cover the display and non-display regions DP-DA and DP-NDA of the display panel DP. An organic encapsulation layer OL may be disposed on the first inorganic encapsulation layer IOL1. The organic encapsulation layer OL may be overlapped with the entire portion of the display region DP-DA and a portion of the non-display region DP-NDA. For example, the organic encapsulation layer OL may not be overlapped with a pad region NDA-PD (e.g., see FIG. 6). The pad region NDA-PD (e.g., see FIG. 6) may be region of the display panel DP, to which a printed circuit board, a flexible circuit board, or the like is connected.

A second inorganic encapsulation layer IOL2 may be disposed on the organic encapsulation layer OL. The second inorganic encapsulation layer IOL2 may be also disposed to cover the display and non-display regions DP-DA and DP-NDA.

In FIG. 5A, the display panel DP is schematically shown to better illustrate a stacking structure of the input-sensing unit ISL. For example, the anti-reflection unit and the window unit, which may be disposed on the input-sensing unit ISL, may not be shown. In the illustrated exemplary embodiment, the input-sensing unit ISL will exemplarily be described as being in the "layer" form described with reference to FIG. 3.

The input-sensing unit ISL may further include a buffer layer IS-BFL, which is directly disposed on the thin encapsulation layer TFE. The buffer layer IS-BFL may be formed of or include at least one of inorganic materials (e.g., aluminum oxide, titanium oxide, silicon oxide, silicon oxynitride, silicon nitride, zirconium oxide, or hafnium oxide). For example, the buffer layer IS-BFL may be formed of or include silicon nitride. An inorganic layer, which is disposed at the topmost level of the thin encapsulation layer TFE, may also include silicon nitride. The silicon nitride layer in the thin encapsulation layer TFE may be formed under a different deposition condition than that forming the buffer layer IS-BFL.

The input-sensing unit ISL in the "layer" form may be directly disposed on a base surface provided by the buffer layer IS-BFL. In this case, a base layer may be omitted, unlike the input-sensing unit in the "panel" form, thereby reducing a thickness of the display module DM. In the illustrated exemplary embodiment, the base surface may be a top surface of the buffer layer IS-BFL. However, the inventive concepts are not limited thereto, and in some exemplary embodiments, the buffer layer IS-BFL may be omitted and the input-sensing unit ISL may be directly disposed on the thin encapsulation layer TFE.

The input-sensing unit ISL may have a multi-layered structure. The input-sensing unit ISL may include a sensing electrode, a signal line connected to the sensing electrode, and at least one insulating layer. The input-sensing unit ISL may sense an external input in a capacitance manner, an electromagnetic induction manner, or a pressure-sensing manner. In an exemplary embodiment, the input-sensing unit ISL may sense an external input in the capacitance manner.

In an exemplary embodiment, the input-sensing unit ISL may include the buffer layer IS-BFL, a first conductive layer IS-CL1, a first insulating layer IS-IL1, a second conductive layer IS-CL2, and a second insulating layer IS-IL2. The buffer layer IS-BFL, the first conductive layer IS-CL1, the first insulating layer IS-IL1, the second conductive layer IS-CL2, and the second insulating layer IS-IL2 may be sequentially disposed on the display panel DP.

Each of the first and second conductive layers IS-CL1 and IS-CL2 may have a single-layered structure or a multi-layered structure including a plurality of layers stacked in the third direction DR3. The single-layered conductive layer may include a metal layer or a transparent conductive layer. The metal layer may be formed of or include at least one of molybdenum, silver, titanium, copper, aluminum, or an alloy thereof. The transparent conductive layer may include at least one of transparent conductive oxide materials, such as indium tin oxide (ITO), indium zinc oxide (IZO), zinc oxide (ZnO), or indium tin zinc oxide (ITZO). In some exemplary embodiments, the transparent conductive layer may include a conductive polymer (e.g., PEDOT), metal nanowires, or graphene.

Each of the first and second conductive layers IS-CL1 and IS-CL2 having the multi-layered conductive layer may include a plurality of metal layers. For example, the multi-layered conductive layer may be provided to have a triple-layered structure including a titanium layer, an aluminum layer, and a titanium layer. Alternatively, the multi-layered conductive layer may include at least one metal layer and at least one transparent conductive layer.

Each of the first and second conductive layers IS-CL1 and IS-CL2 may include a plurality of conductive patterns. Hereinafter, the first conductive layer IS-CL1 will be described as including first conductive patterns, and the second conductive layer IS-CL2 will be described as including second conductive patterns. Each of the first and second conductive patterns may include at least one sensing electrode and at least one signal line.

A stacking structure and a material of the sensing electrode may be determined in consideration of technical requirements on sensing sensitivity. The sensing sensitivity may be affected by RC delay, and the conductive layer including the metal layer may have electric resistance lower than that of the transparent conductive layer. As such, the use of the conductive layer including the metal layer may reduce an RC delay value and reduce a charging time to charge a capacitor defined between the sensing electrodes. The sensing electrodes including the transparent conductive layer may be hardly recognized by a user as compared to that including the metal layer, and may have an increased input area, which may increase capacitance.

In an exemplary embodiment, the sensing electrodes including the metal layer may have a mesh structure, which will described in more detail below, and in this case, it may be possible to prevent the sensing electrodes from being recognized by a user.

In an exemplary embodiment, the first insulating layer IS-IL1 and the second insulating layer IS-IL2 may be formed of or include an organic material. Hereinafter, the first insulating layer IS-IL1 will be referred to as a first organic layer IS-IL1. The second insulating layer IS-IL2 will be referred to as a second organic layer IS-IL2.

Referring to the region SS of FIG. 5B, the first organic layer IS-IL1 may include a first base resin RS1 and a first hollow polymer HP1. The first hollow polymer HP1 may include a first shell SH1, in which a first hollow OP1 is defined. The first shell SH1 may surround the first hollow OP1 and may define an outer surface of the first hollow polymer HP1.

The first hollow OP1 may have a mean diameter ranging from about 20 nm to about 150 nm. For example, the first hollow OP1 may have a mean diameter ranging from about 50 nm to about 100 nm. When the first hollow OP1 has a diameter ranging from about 20 nm to about 150 nm, it may be possible to suppress or minimize a haze issue in the first organic layer IS-IL1.

In an exemplary embodiment, the first base resin RS1 may be formed of or include at least one of polyimide, polyurethane, siloxane resin, acrylic resin, and epoxy resin. The first shell SH1 may be formed of or include at least one of polyimide, polyurethane, polystyrene, acrylic resin, and epoxy resin. Materials for the first base resin RS1 and the first hollow polymer HP1 may each be independently selected from the above materials, and in this case, materials forming the first organic layer IS-IL1 may be variously combined.

Referring to the region TT of FIG. 5C, the second organic layer IS-IL2 may include a second base resin RS2 and a second hollow polymer HP2. The second hollow polymer HP2 may include a second shell SH2, in which a second hollow OP2 is defined.

In an exemplary embodiment, the first base resin RS1 may be formed of or include the same material as the second base resin RS2. The first hollow polymer HP1 may be formed of or include the same material as the second hollow polymer HP2. For example, the first and second organic layers IS-IL1 and IS-IL2 may be formed of of the same material.

In an exemplary embodiment, the second base resin RS2 and the second hollow polymer HP2 of FIG. 5C may have substantially the same features as the first base resin RS1 and the first hollow polymer HP1 described with reference to FIG. 5B.

Figure 6:
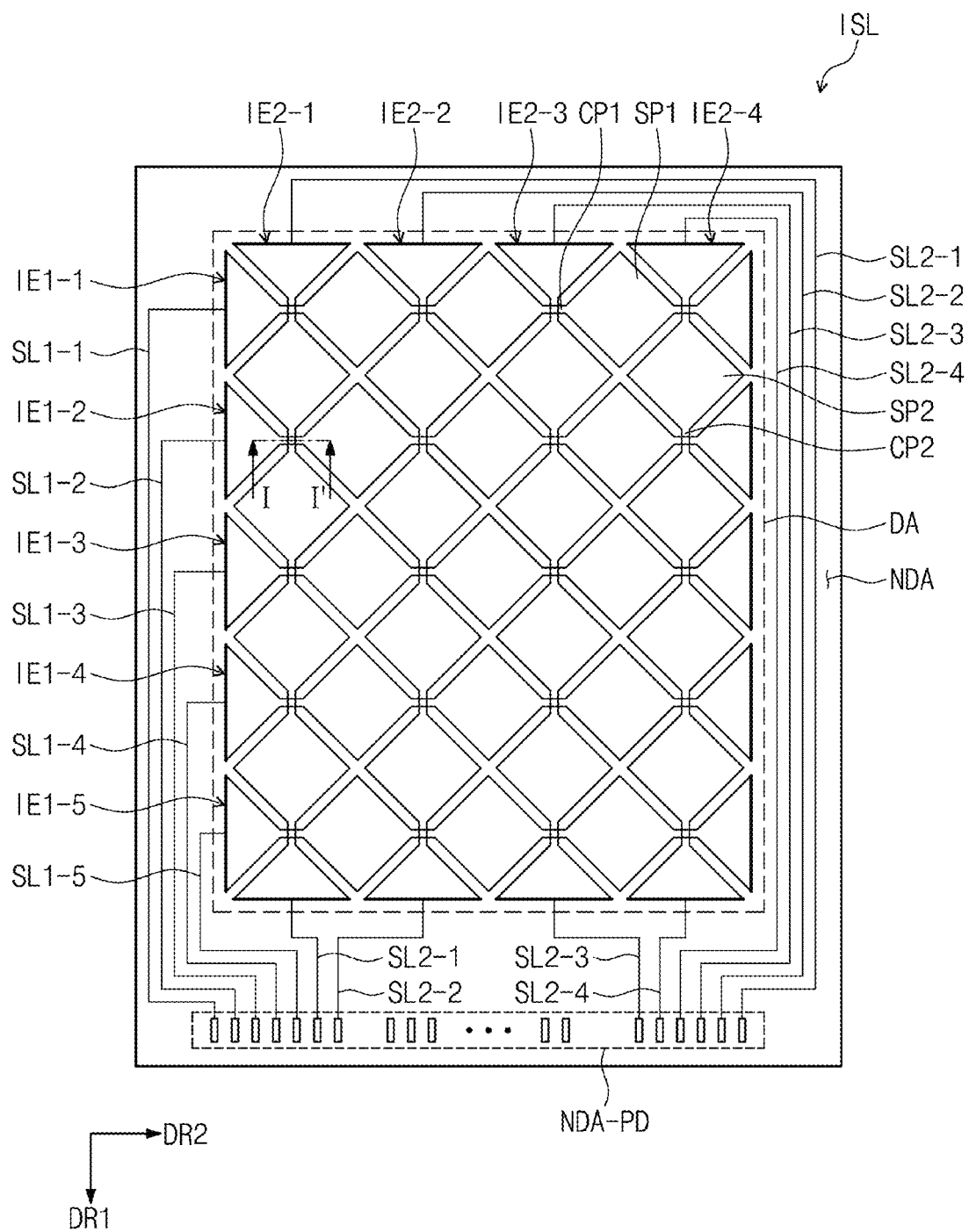
FIG. 6 is a plan view illustrating an input-sensing unit according to an exemplary embodiment.
Figure 7A:
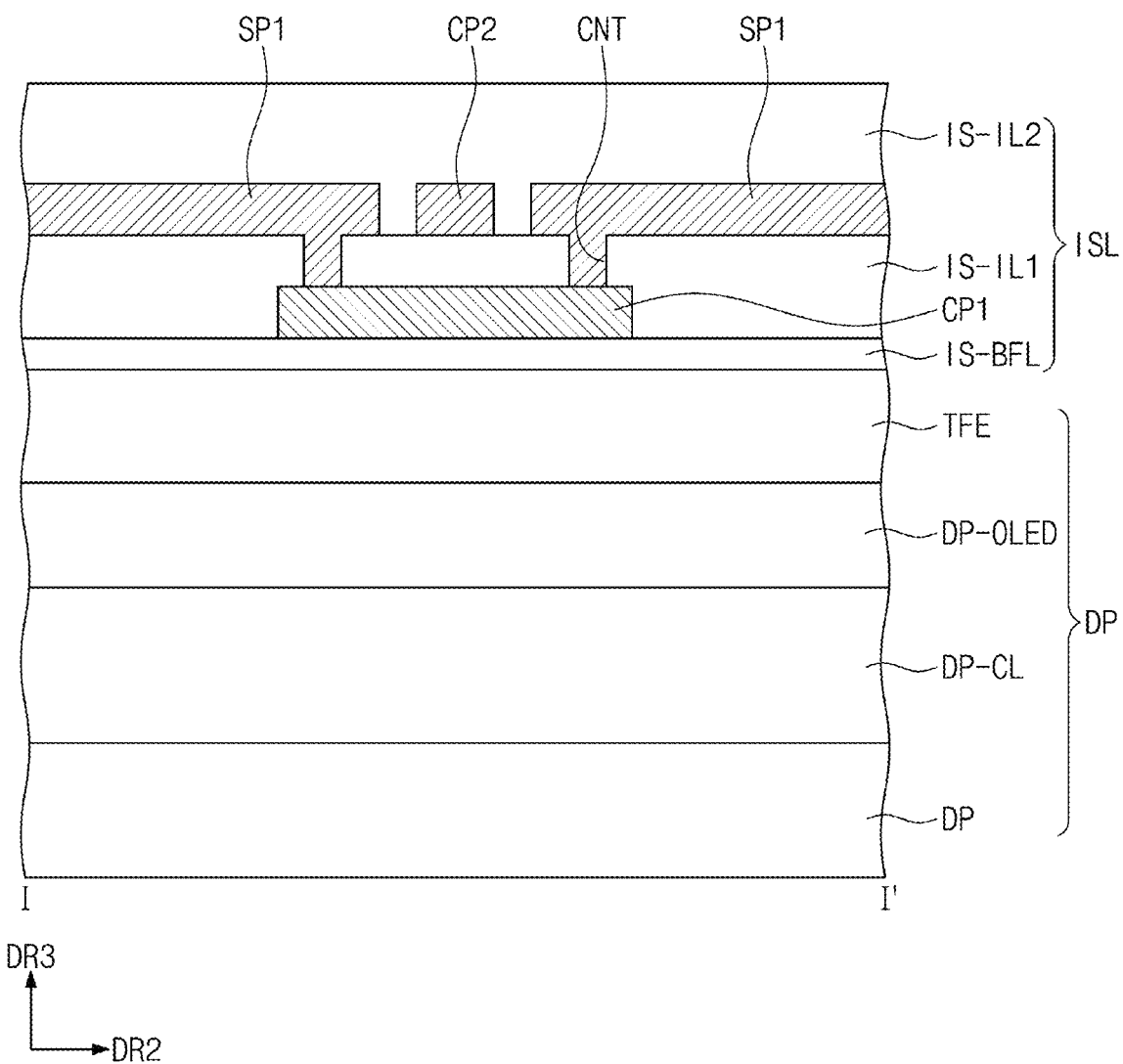
FIG. 7A is a cross-sectional taken along line I-I' of FIG. 6 according to an exemplary embodiment.
Figure 7B:
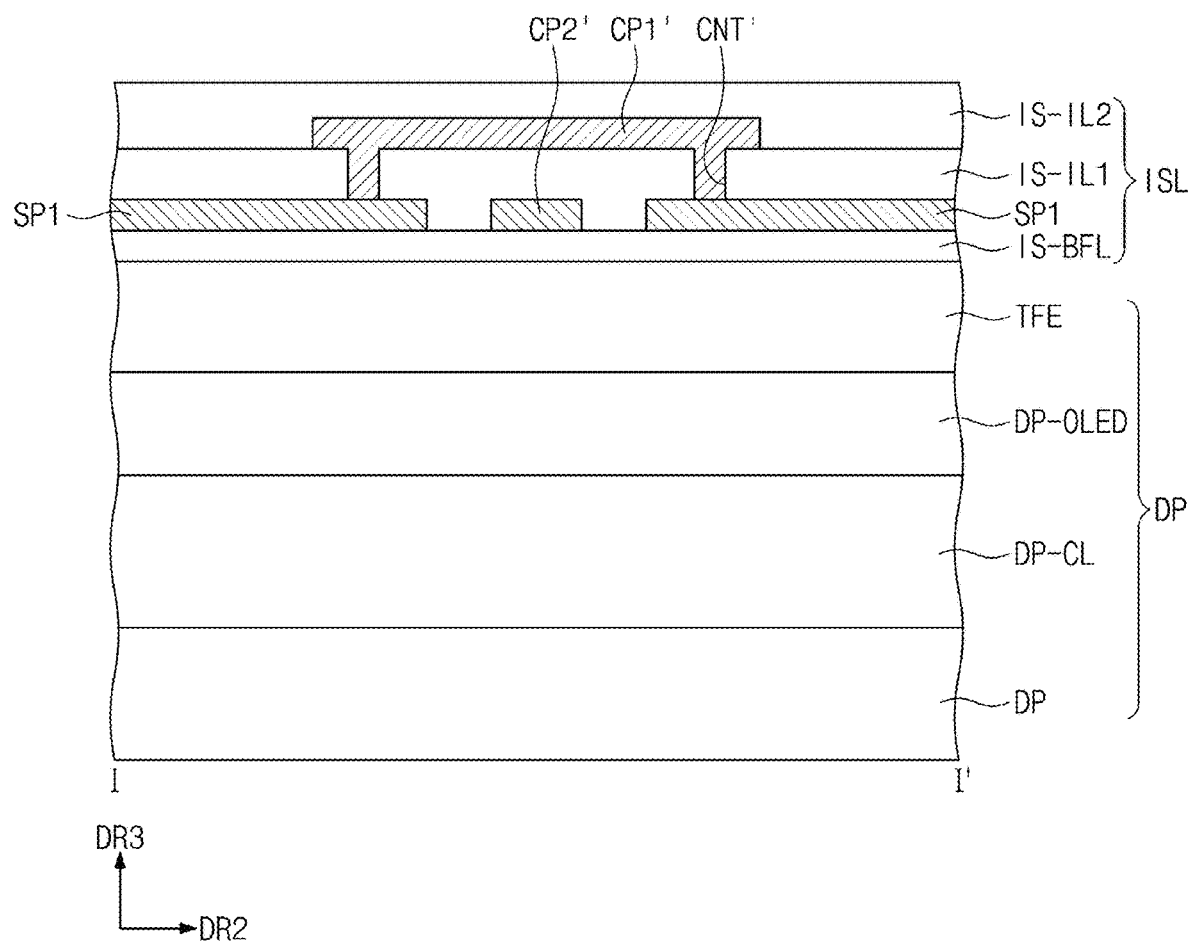
FIG. 7B is a cross-sectional view taken along line I-I' of FIG. 6 according to another exemplary embodiment.
Figure 7C:
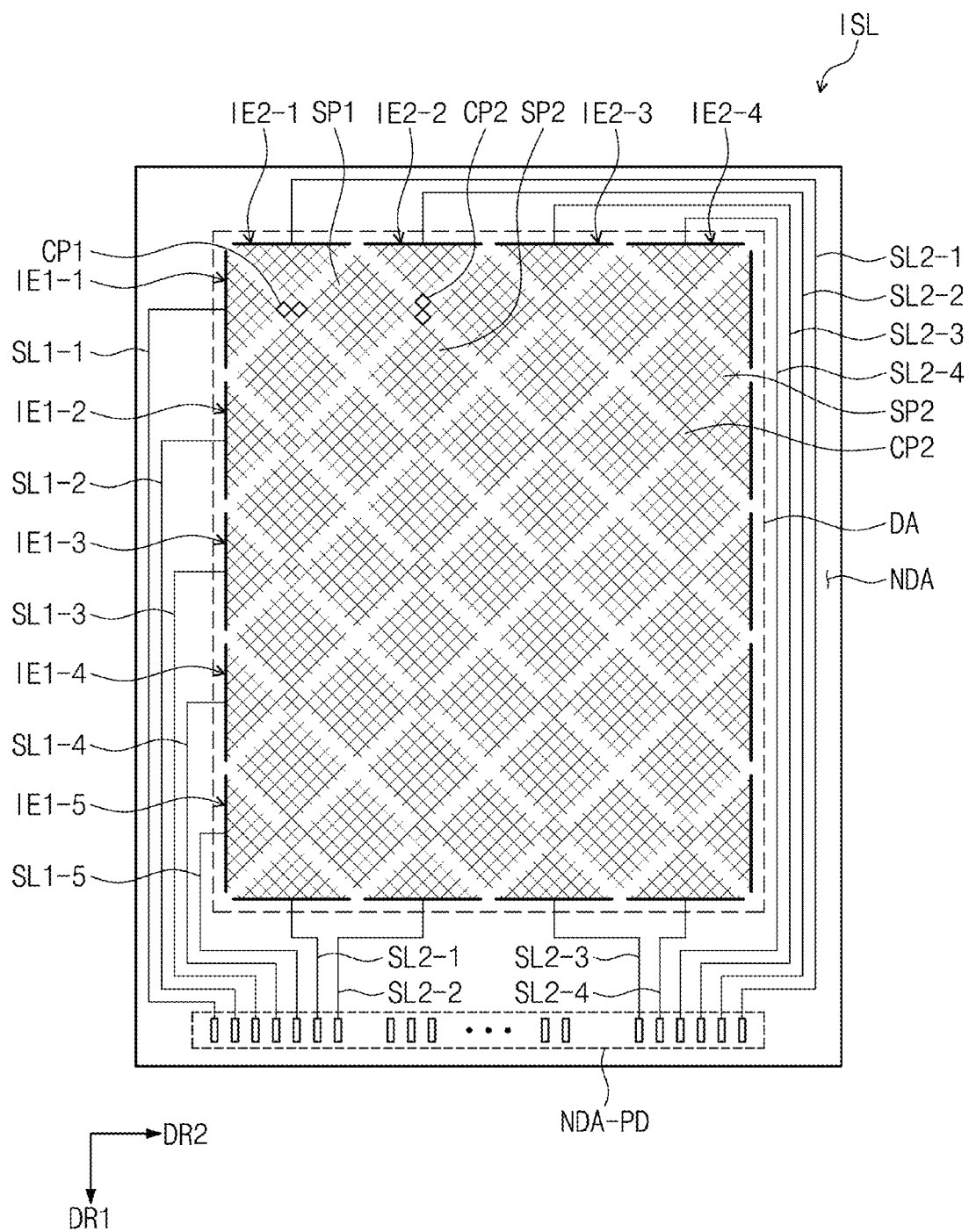
FIG. 7C is a plan view illustrating an input-sensing unit according to another exemplary embodiment.

FIG. 6 is a plan view illustrating the input-sensing unit ISL according to an exemplary embodiment. FIG. 7A is a cross-sectional view taken along line I-I' of FIG. 6 according to an exemplary embodiment. FIG. 7B is a cross-sectional view taken along line I-I' of FIG. 6 according to another exemplary embodiment. FIG. 7C is a plan view illustrating the input-sensing unit ISL according to another exemplary embodiment.

As shown in FIG. 6, the input-sensing unit ISL may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4. In some exemplary embodiments, the input-sensing unit ISL may further include an optical dummy electrode disposed in a boundary region between the first sensing electrodes IE1-1 to IE1-5 and the second sensing electrodes IE2-1 to IE2-4.

The first sensing electrodes IE1-1 to IE1-5 may be disposed to cross the second sensing electrodes IE2-1 to IE2-4. The first sensing electrodes IE1-1 to IE1-5 may be arranged in the first direction DR1, and each of being a pattern extending in the second direction DR2. In an exemplary embodiment, the first sensing electrodes IE1-1 to IE1-5 may sense an external input in a self-capacitance manner. In an exemplary embodiment, the second sensing electrodes IE2-1 to IE2-4 may sense an external input in a mutual-capacitance manner.

Each of the first sensing electrodes IE1-1 to IE1-5 may include first sensor units SP1 and first portions CP1. Each of the second sensing electrodes IE2-1 to IE2-4 may include second sensor units SP2 and second portions CP2. The first sensor units SP1 and the first portions CP1 may be provided as a single object or may be electrically connected to each other through penetration holes. The second sensor units SP2 and the second portions CP2 may be provided as a single object or may be electrically connected to each other through penetration holes.

Referring to FIG. 7A, the first portion CP1 may be directly disposed on the buffer layer IS-BFL. The first organic layer IS-IL1 may be disposed on the buffer layer IS-BFL to cover the first portion CP1. The first sensor units SP1 and the second portion CP2 may be disposed on the first organic layer IS-IL1.

A plurality of penetration holes CNT penetrating the first organic layer IS-IL1 may be defined in the first organic layer IS-IL1. The first sensor units SP1 may be electrically connected to the first portion CP1 through the penetration holes CNT. The first sensor units SP1, which are spaced apart from each other, may be electrically connected to each other through the first portion CP1. The first portions CP1 may be formed of or include a material having a resistance is lower than that of the first sensor units SP1.

In an exemplary embodiment, the first portion CP1 may be the first conductive pattern. The first portion CP1 may be a pattern that is formed by patterning the first conductive layer IS-CL1 (e.g., see FIG. 5A).

The first sensor units SP1 and the second portion CP2 may be the second conductive patterns. In particular, the first sensor units SP1 and the second portion CP2 may be patterns that are formed by patterning the second conductive layer IS-CL2 (e.g., see FIG. 5A).

The first and second organic layers IS-IL1 and IS-IL2 may have a dielectric constant ranging from about 1.3 to 3.0. The dielectric constant of the first organic layer IS-IL1 may be adjusted by a content of the first hollow polymer HP1 in the first organic layer IS-IL1. The dielectric constant of the second organic layer IS-IL2 may be adjusted by a content of the second hollow polymer HP2 in the second organic layer IS-IL2. This will be described in more detail below.

FIG. 7B is a cross-sectional view taken along line I-I' of FIG. 6 according to another exemplary embodiment. In FIG. 7B, the first conductive patterns of the first conductive layer IS-CL1 and the second conductive patterns of the second conductive layer IS-CL2 show in FIG. 7A are exchanged with each other.

Referring to FIG. 7B, first sensor units SP1' and a second portion CP2' may be directly disposed on the buffer layer IS-BFL. The first organic layer IS-IL1 may be disposed on the buffer layer IS-BFL to cover the first sensor units SP1' and the second portion CP2'. A first portion CP1' may be disposed on the first organic layer IS-ILL and the second organic layer IS-IL2 may be disposed on the first organic layer IS-IL1 to cover the first portion CP1'.

The first sensor units SP1' and the second portion CP2' may be the first conductive patterns. The first sensor units SP1' and the second portion CP2' may be patterns that are formed by patterning the first conductive layer IS-CL1 (e.g., see FIG. 5A).

The first portion CP1' may be the second conductive pattern. The first portion CP1' may be a pattern that is formed by patterning the second conductive layer IS-CL2 (e.g., see FIG. 5A).

FIGS. 7A and 7B exemplarily illustrate that the input-sensing unit ISL includes the buffer layer IS-BFL, but in some exemplary embodiments, the buffer layer IS-BFL may be omitted. For example, the buffer layer IS-BFL shown in FIG. 7A may be omitted, and the first portion CP1 may be directly disposed on the top surface of the thin encapsulation layer TFE. As another example, the buffer layer IS-BFL shown in FIG. 7B may be omitted, and the first sensor units SP1' and the second portion CP2' may be directly disposed on the top surface of the thin encapsulation layer TFE. An inorganic encapsulation layer may be provided as the top side of the thin encapsulation layer TFE.

FIG. 7C is a plan view illustrating an input-sensing unit ISL according to another exemplary embodiment. In FIG. 7C, the first and second sensor units SP1 and SP2 have a mesh shape to improve the flexibility of the display device DD. Each of the first and second sensor units SP1 and SP2 may include a metal layer. The first and second sensor units SP1 and SP2 may be referred to as metal mesh patterns.

Figure 8:
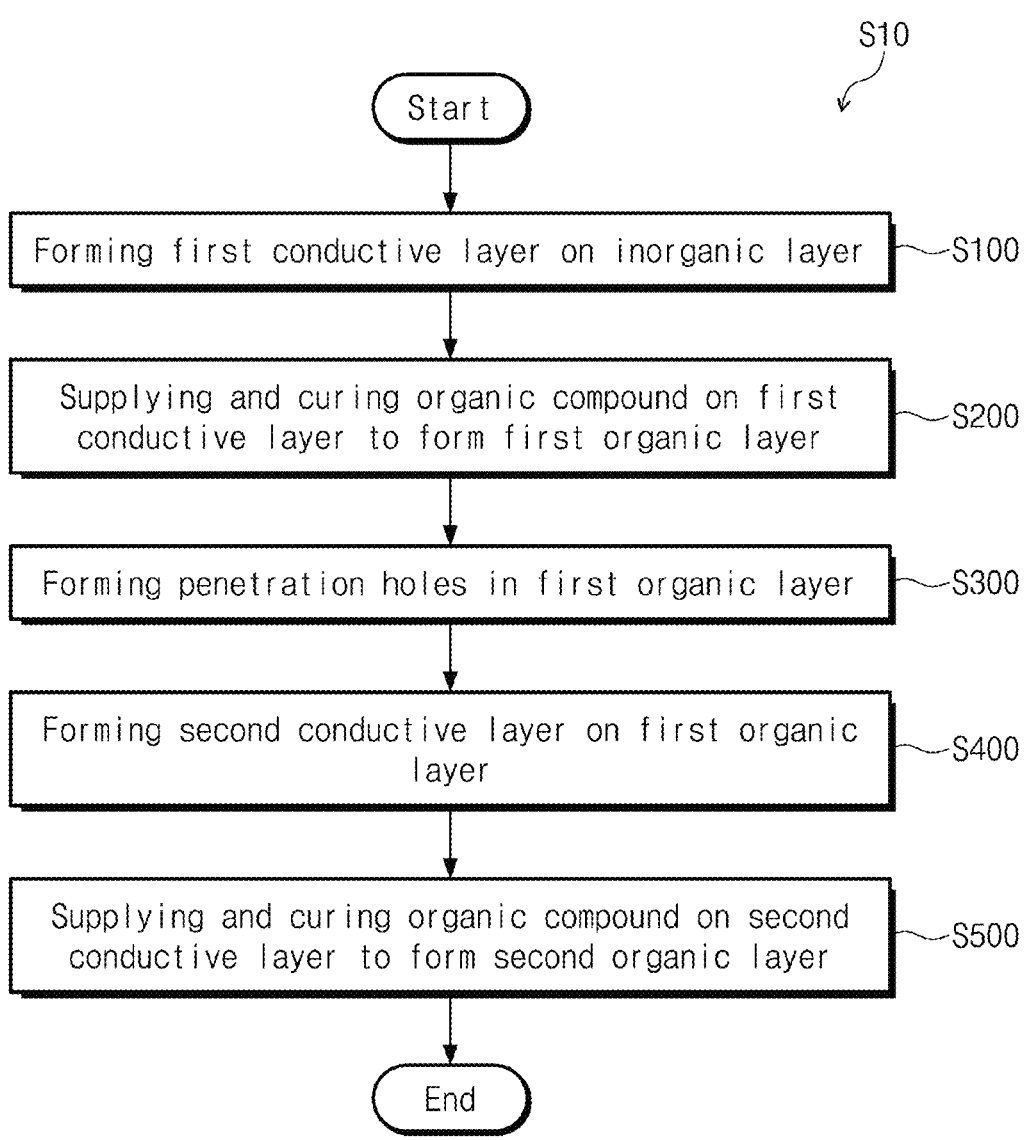
FIG. 8 is a flow chart illustrating a method of fabricating an input-sensing unit according to an exemplary embodiment.
Figure 9A:
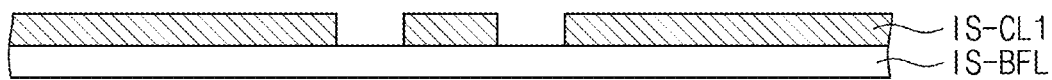
FIGS. 9A and 9B are cross-sectional views illustrating some steps of a method of fabricating an input-sensing unit according to an exemplary embodiment.
Figure 9B:
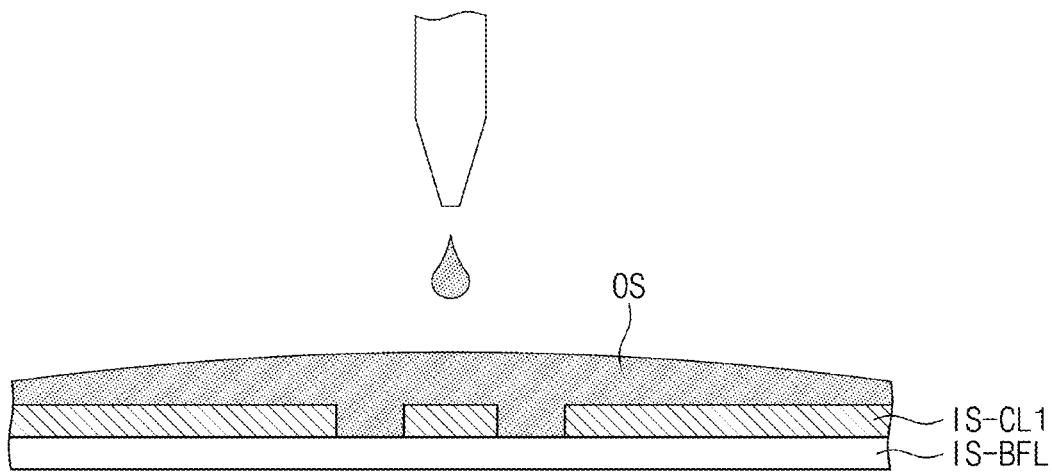
Figure 9C:
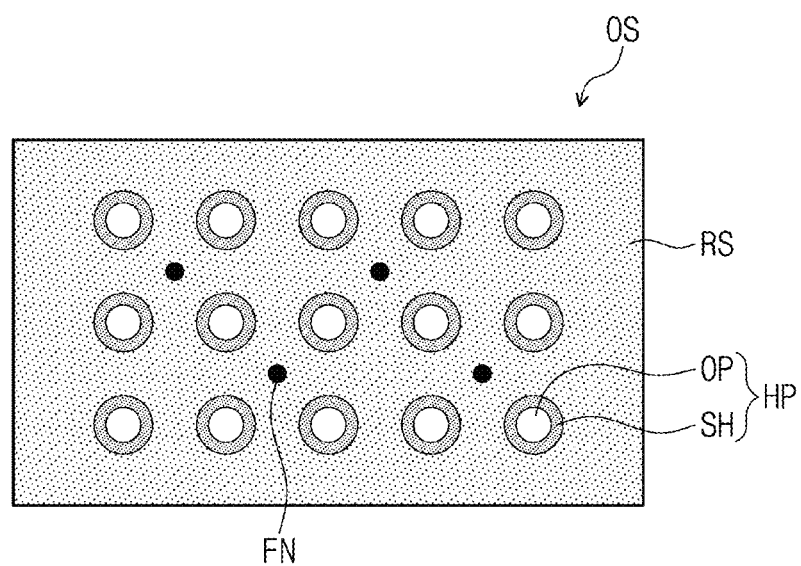
FIG. 9C is a view illustrating an organic layer compound according to an exemplary embodiment.
Figure 9D:
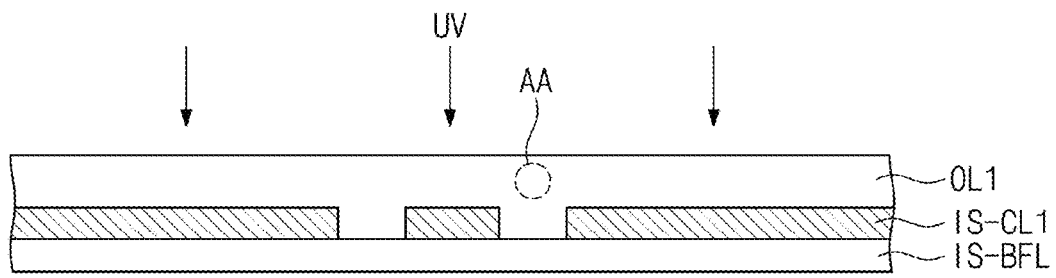
FIG. 9D is a cross-sectional view illustrating a method of fabricating an input-sensing unit according to an exemplary embodiment.
Figure 9E:
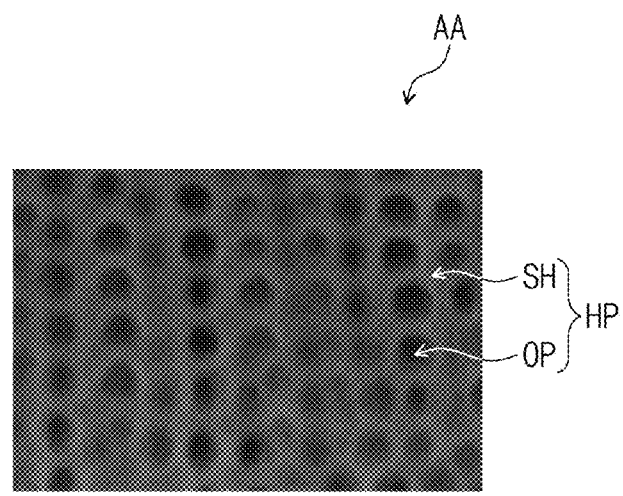
FIG. 9E is an image of region AA of FIG. 9D obtained using a focused ion beam (FIB).

FIG. 8 is a flow chart illustrating a method of fabricating the input-sensing unit ISL (in S10) according to an exemplary embodiment. FIGS. 9A and 9B are cross-sectional views illustrating some steps of a method of fabricating the input-sensing unit ISL according to an exemplary embodiment. FIG. 9C is a view illustrating an organic layer compound OS according to an exemplary embodiment. FIG. 9D is a cross-sectional view illustrating a step of a method of fabricating the input-sensing unit ISL according to an exemplary embodiment. FIG. 9E shows an image of region AA of FIG. 9D obtained using a focused ion beam (FIB). FIGS. 9F to 9I are cross-sectional views illustrating some steps of a method of fabricating the input-sensing unit ISL according to an exemplary embodiment.

Referring to FIG. 8, a method of fabricating the input-sensing unit ISL (in S10) may include forming the first conductive layer IS-CL1 on an inorganic layer (in S100), supplying and curing an organic layer compound OS on the first conductive layer IS-CL1 to form a first organic layer OL1 (in S200), forming a plurality of penetration holes CTH1 and CTH2 in the first organic layer OL1 (in S300), forming the second conductive layer IS-CL2 on the first organic layer OL1 (in S400), and supplying and curing an organic layer compound OS on the second conductive layer IS-CL2 to form a second organic layer OL2 (in S500).

Referring to FIGS. 8 and 9A, the step of forming of the first conductive layer IS-CL1 on the inorganic layer (in S100) may include directly forming the first conductive layer IS-CL1 on the inorganic layer. In FIG. 9A to 9I, the inorganic layer is exemplarily illustrated as the buffer layer IS-BFL, but the inventive concepts are not limited thereto. In some exemplary embodiments, the inorganic layer may be the second inorganic encapsulation layer IOL2 of the thin encapsulation layer TFE (e.g., see FIG. 4).

Referring to FIGS. 8 and 9B, the step of forming of the first organic layer OL1 (in S200) may include forming the organic layer compound OS on the buffer layer IS-BFL to cover the first conductive layer IS-CL1.

Referring to FIG. 9C, the organic layer compound OS may include a base resin RS and a hollow polymer HP. In addition, the organic layer compound OS may further include a functional material FN. The functional material FN may include at least one of a dispersing agent and a curing initiator. The dispersing agent may improve a dispersion property of the hollow polymer HP in the base resin RS. The curing initiator may be used to initiate a curing reaction to cure the base resin RS. For example, when the organic layer compound OS is irradiated with an ultraviolet light UV, the base resin RS may be cured by the curing initiator. Alternatively, when the organic layer compound OS is applied with heat, the base resin RS may be cured by the curing initiator. Various known materials may be used as the dispersing agent and the curing initiator.

In an exemplary embodiment, a content of the hollow polymer HP may range from about 10 wt % to about 70 wt %, and may preferably range from about 10 wt % to about 40 wt %. If the hollow polymer HP has a content of about 10 wt % or lower, the dielectric constant of the organic layer may not be effectively lowered by the hollow polymer HP. If the hollow polymer HP has a content of about 40 wt % or higher, it may be difficult to secure the pattern reliability in a photoresist process, which is performed to form the penetration hole in the first organic layer OL1.

Referring to FIG. 9D, the step of forming of the first organic layer OL1 (in S200) may include curing the organic layer compound OS as described above. In an exemplary embodiment, the step of curing of the organic layer compound OS may include irradiating the organic layer compound OS with an ultraviolet light UV. In this case, the organic layer compound OS may be cured by the ultraviolet light UV to form the first organic layer OL1 on the first conductive layer IS-CL1. FIG. 9D exemplarily illustrates the curing method as irradiating the organic layer compound OS with the ultraviolet light UV, but the inventive concepts are not limited thereto. For example, in another exemplary embodiment, the organic layer compound OS may be cured by heat, not the ultraviolet light UV, as described above, or by the heat and the ultraviolet light UV, and this may be the same for the curing method to be described with reference to FIG. 9I.

FIG. 9E is an image of region AA of FIG. 9D obtained using a focused ion beam (FIB). FIG. 9E shows a hollow OP and a shell SH of the hollow polymer HP in the region AA.

Figure 9F:
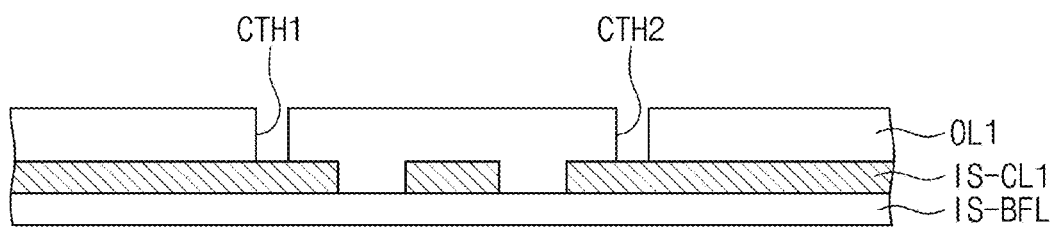
FIGS. 9F, 9G, 9H, and 9I are cross-sectional views illustrating some steps of a method of fabricating an input-sensing unit according to an exemplary embodiment.

Referring to FIGS. 8 and 9F, the step of forming of the penetration holes CTH1 and CTH2 in the first organic layer OL1 (in S300) may include a photoresist process using a mask.

Figure 9G:
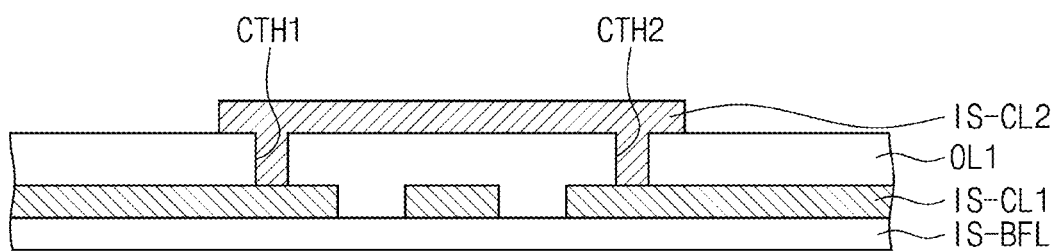

Referring to FIGS. 8 and 9G, the step of forming of the second conductive layer IS-CL2 on the first organic layer OL1 (in S400) may include forming the second conductive layer IS-CL2 on the first organic layer OL1 with the penetration holes CTH1 and CTH2. The first conductive patterns of the first conductive layer IS-CL1, which are spaced apart from each other, may be connected to each other through the second conductive layer IS-CL2.

Figure 9H:
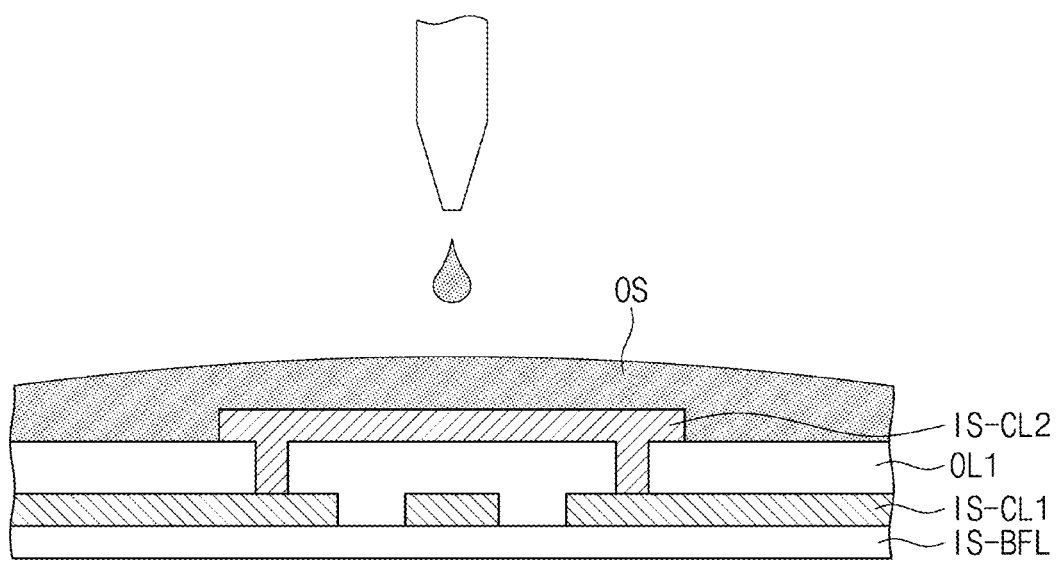

Referring to FIGS. 8 and 9H, the step of forming of the second organic layer OL2 (in S500) may be performed in substantially the same manner as that forming of the first organic layer OL1 (in S200). An organic layer compound OS, which is substantially the same as that described with reference to FIG. 9B, may be used to form the second organic layer OL2. In this case, the first and second organic layers OL1 and OL2 may be formed of the same material.

Figure 9I:
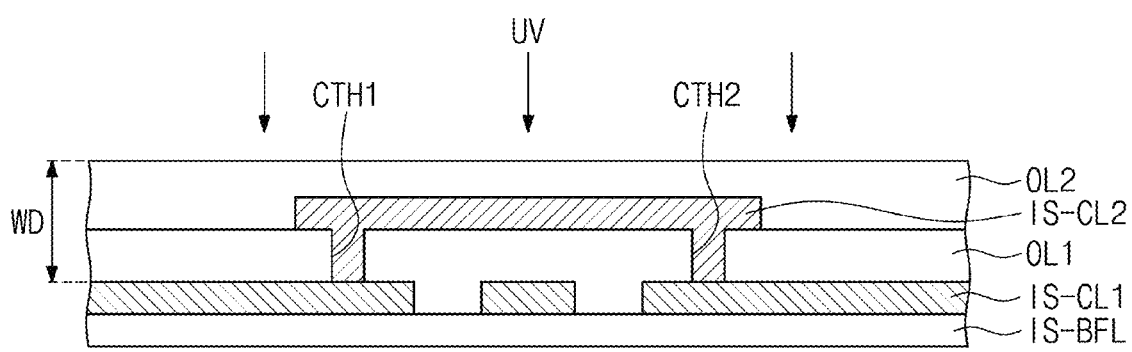

Referring to FIG. 9I, the step of forming of the second organic layer OL2 (in S500) may include a step of curing the organic layer compound OS as described above. In an exemplary embodiment, the step of curing of the organic layer compound OS may include irradiating the organic layer compound OS with an ultraviolet light UV. In this case, the organic layer compound OS may be cured by the ultraviolet light UV to form the second organic layer OL2 on the second conductive layer IS-CL2. The second organic layer OL2 may include a base resin RS and a hollow polymer HP, as in the first organic layer OL1.

The first and second organic layers OL1 and OL2 may be used as the first and second organic layers IS-IL1 and IS-IL2, respectively. A sum WD of thicknesses of the first and second organic layers OL1 and OL2 may be less than about 1.8 μm, more particularly, less than about 1.5 μm.

The following Tables 1 and 2 show dielectric constants measured from organic layers including a base resin and a hollow polymer.

In the experiment shown in Table 1, the base resin was formed of siloxane and the shell of the hollow polymer was formed of an acrylic resin.

More particularly, in the organic layer of the embodiment 1, the content of the hollow polymer was 15 wt %. In the organic layer of the embodiment 2, the content of the hollow polymer was 30 wt %. In the organic layer of the embodiment 3, the hollow polymer was 40 wt %. In the comparative example 1, the organic layer did not include any hollow polymer.

The reduction ratios of the dielectric constants were given by rounding values, which were calculated by a formula (Ec−En)/Ec, to the nearest whole number, where Ec and En were the dielectric constants of the organic layer in the comparative example 1 and in the embodiment 1, 2, or 3, respectively.

TABLE 1

| Embodiments | Content of hollow polymer in organic compound | Dielectric constant | Reduction ratio of dielectric constant |
| --- | --- | --- | --- |
| Embodiment 1 | 15 wt % | 2.68 | 20% |
| Embodiment 2 | 30 wt % | 1.83 | 45% |

TABLE 1-continued

| Embodiments | Content of hollow polymer in organic compound | Dielectric constant | Reduction ratio of dielectric constant |
| --- | --- | --- | --- |
| Embodiment 3 | 40 wt % | 1.38 | 59% |
| Comparative Example 1 | 0 wt % | 3.35 | — |

Referring to the results of Table 1, the dielectric constants in the embodiments 1 to 3 ranged from 1.38 to 2.68, which were less than the dielectric constant of 3.35 in the comparative example 1. In the embodiment 1, in which the content of the hollow polymer was 15 wt %, the dielectric constant of the organic layer was reduced by 20%, compared with that of the comparative example 1.

In the embodiment 2, in which the content of the hollow polymer was 30 wt %, the dielectric constant of the organic layer was reduced by 45%, compared with that of comparative example 1.

In the embodiment 3, in which the content of the hollow polymer was 40 wt %, the dielectric constant of the organic layer was reduced by 59%, compared with that of comparative example 1.

This shows that if the hollow polymer in the organic layer has a content ranging from about 10 wt % to about 70 wt %, the organic layer has a dielectric constant of 3.0 or less. For example, when the hollow polymers in the first and second organic layers IS-IL1 and IS-IL2 have a content ranging from about 10 wt % to about 70 wt %, the dielectric constants of the first and second organic layers IS-IL1 and IS-IL2 may range from about 1.3 to about 3.0.

In the experiment shown in Table 2, the base resin was formed of polyimide (PI) and the shell of the hollow polymer was formed of acrylic resin.

More particularly, in the organic layer of the embodiment 4, the content of the hollow polymer was 30 wt %. In the organic layer of the embodiment 5, the content of the hollow polymer was 40 wt %. In the comparative example 2, the organic layer did not contain any hollow polymer.

The reduction ratios of the dielectric constants were given by rounding values, which were calculated by a formula (Ec−En)/Ec, to the nearest whole number, where Ec and En were the dielectric constants of organic layer in the comparative example 2 and in the embodiment 4 or 5, respectively.

TABLE 2

| Embodiments | Content of hollow polymer in organic compound | Dielectric constant | Reduction ratio of dielectric constant |
| --- | --- | --- | --- |
| Embodiment 4 | 30 wt % | 2.90 | 18% |
| Embodiment 5 | 40 wt % | 2.71 | 24% |
| Comparative Example 2 | 0 wt % | 3.52 | — |

Referring to the results of Table 2, the dielectric constants in the embodiments 4 and 5 ranged from 2.71 to 2.90, which were less than the dielectric constant of 3.32 in the comparative example 2. In the embodiment 4, in which the content of the hollow polymer was 30 wt %, the dielectric constant of the organic layer was reduced by 18%, compared with that of the comparative example 2.

In the embodiment 5, in which the content of the hollow polymer was 40 wt %, the dielectric constant of the organic layer was reduced by 24%, compared with that of the comparative example 2.

These results show that the presence of the hollow polymer reduces the dielectric constant of the organic layer.

When the hollow polymer in the organic layer has a content ranging from about 10 wt % to about 70 wt %, the dielectric constant of the organic layer may be reduced to a value of 3.0 or less. For example, the dielectric constants of the first and second organic layers IS-IL1 and IS-IL2 may range from about 1.3 to about 3.0.

Table 3 shows a reduction ratio of capacitance (%) and an improvement in touch sensitivity (dB) in each embodiment, calculated based on the comparative example B with the dielectric constant of 3.5.

The organic layers in the embodiments A, B, and C had dielectric constants of 2.3, 2.6, and 2.9. The organic layers in the comparative examples A and B had dielectric constants of 3.2 and 3.5.

TABLE 3

| Embodiments | Dielectric constant | Reduction ratio of capacitance | Improvement of touch sensitivity (dB) |
|---|---|---|---|
| Embodiment A | 2.3 | 34% | 1.9 |
| Embodiment B | 2.6 | 26% | 1.3 |
| Embodiment C | 2.9 | 17% | 0.9 |
| Comparative Example A | 3.2 | 9% | 0.3 |
| Comparative Example B | 3.5 | — | — |

Referring to the results of Table 3, for the embodiments A, B, and C, the capacitance was reduced by 17% or greater, and the touch sensitivity was improved by 0.9 dB or greater, compared with the comparative example B. For the comparative example A, the capacitance was reduced by 9% and the touch sensitivity was improved by 0.3 dB, compared with the comparative example B.

In the embodiments A, B, and C corresponding to exemplary embodiments described above, the organic layer was provided to have a dielectric constant of 2.9 or lower, and in this case, the electrostatic capacitance was reduced by 17% or greater and the touch sensitivity was improved by 0.9 dB or greater, compared with the comparative example B, in which the organic layer had a dielectric constant of 3.5.

Referring to the results of Tables 1 to 3, the input-sensing unit according to an exemplary embodiment may include the first and second organic layers IS-IL1 and IS-IL2, in which dielectric constants thereof are adjusted to be within a range from 1.3 to 3.0. In this case, it may be possible to suppress a parasitic capacitance issue, which may occur between the first and second organic layers IS-IL1 and IS-IL2 and the electrodes of the display panel DP, and to improve the touch sensitivity of the input-sensing unit.

According to an exemplary embodiment, an input-sensing unit may include first and second organic layers having a dielectric constant range from 1.3 to 3.0 and including hollow polymers that have content ranges from about 10 wt % to about 70 wt %. In this manner, the input-sensing unit may have a good touch sensitivity, even when it has a small thickness. In addition, since the first and second organic layers IS-IL1 and IS-IL2 are formed in the same manner, it may be possible to reduce process time and costs for fabricating the input-sensing unit. The display device including the input-sensing unit according to exemplary embodiments may have a good touch sensitivity, even when the display device has a reduced thickness, and this make it possible to improve both flexibility and touch reliability of the display device.

According to exemplary embodiments, an input-sensing unit may have a good touch sensitivity property, even when it has a small thickness.

According to exemplary embodiments, a display device may include an input-sensing unit with improved reliability.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An input-sensing unit, comprising:
a first conductive layer, a first organic layer, a second conductive layer, and a second organic layer sequentially stacked one over another,
wherein:
the first organic layer comprises a first base resin and a first hollow polymer; and
the second organic layer comprises a second base resin and a second hollow polymer.

2. The input-sensing unit of claim 1, wherein:
the first and second base resins comprise substantially the same material; and
the first and second hollow polymers comprise substantially the same material.

3. The input-sensing unit of claim 1, wherein the first and second organic layers have dielectric constants ranging from about 1.3 to about 3.0.

4. The input-sensing unit of claim 3, wherein a content of the first hollow polymer in the first organic layer and a content of the second hollow polymer in the second organic layer are each in a range of about 10 wt % to about 70 wt %.

5. The input-sensing unit of claim 1, wherein:
the first hollow polymer comprises a first shell that defines a first hollow therein;
the second hollow polymer comprises a second shell that defines a second hollow therein; and
each of the first and second shells comprises at least one of polyimide, polyurethane, polystyrene, acrylic resin, and epoxy resin.

6. The input-sensing unit of claim 5, wherein each of the first and second hollows have a mean diameter ranging from about 20 nm to about 150 nm.

7. The input-sensing unit of claim 1, wherein at least one of the first and second conductive layers comprises at least one of molybdenum, silver, titanium, copper, aluminum, alloys thereof, indium tin oxide, indium zinc oxide, zinc oxide, and indium tin zinc oxide.

8. A display device, comprising:
a display panel;
a first conductive layer disposed on the display panel;
a first organic layer disposed on the first conductive layer;
a second conductive layer disposed on the first organic layer; and
a second organic layer disposed on the second conductive layer,
wherein:
the first organic layer comprises a first base resin and a first hollow polymer; and
the second organic layer comprises a second base resin and a second hollow polymer.

9. The display device of claim 8, wherein:
the first and second base resins comprise substantially the same material; and
the first and second hollow polymers comprise substantially the same material.

10. The display device of claim 8, wherein:
the display panel comprises a light-emitting device layer and a thin encapsulation layer covering the light-emitting device layer; and
the first conductive layer is directly disposed on the thin encapsulation layer.

11. The display device of claim 8, further comprising an inorganic layer disposed on the display panel,
wherein the first conductive layer is directly disposed on the inorganic layer.

12. The display device of claim 8, wherein the display panel comprises a flexible display panel.

13. The display device of claim 8, wherein:
at least one of the first and second conductive layers comprises a plurality of conductive patterns; and
the plurality of conductive patterns comprise a sensing electrode.

\* \* \* \* \*